(12) United States Patent
Kim et al.

(10) Patent No.: US 7,820,994 B2
(45) Date of Patent: Oct. 26, 2010

(54) SYSTEM TO TEST ELECTRONIC PART AND METHOD OF CONTROLLING THE SAME

(75) Inventors: Seono Kim, Suwon-si (KR); Hyung Jung Yong, Suwon-si (KR); Chul Jun Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 281 days.

(21) Appl. No.: 12/076,116

(22) Filed: Mar. 13, 2008

(65) Prior Publication Data

US 2008/0243428 A1    Oct. 2, 2008

(30) Foreign Application Priority Data

Mar. 29, 2007    (KR) .................... 10-2007-0030780

(51) Int. Cl.
*G01N 21/86* (2006.01)
*G01R 31/26* (2006.01)
*H05K 1/00* (2006.01)

(52) U.S. Cl. ............................ 250/559.29; 250/559.33; 324/765; 439/68

(58) Field of Classification Search ............ 250/559.29, 250/559.3, 559.33, 559.38, 559.39, 221, 250/222.1; 702/152; 324/158.1, 755, 765; 439/68, 73, 248, 264; 356/139.04, 139.05, 356/139.06
See application file for complete search history.

(56) References Cited

U.S. PATENT DOCUMENTS 7,120,519 B2 * 10/2006 Okabayashi et al. ........ 700/254
2007/0271638 A1 * 11/2007 Johnson et al. ................ 901/3

FOREIGN PATENT DOCUMENTS

KR    10-2006-0077598    7/2006

* cited by examiner

*Primary Examiner*—Georgia Y Epps
*Assistant Examiner*—Don Williams
(74) *Attorney, Agent, or Firm*—Staas & Halsey LLP

(57) ABSTRACT

Disclosed herein are a system to test an electronic part and a method of controlling the same, which are capable of automatically detecting a position of a socket according to a variation in a position of the socket to efficiently test the electronic part. The system to test an electronic part using a robot to automatically test the electronic part includes: a distance measuring unit measuring a distance between a socket mounted on a substrate to test the electronic part and a reference block to provide a reference position; a position measuring unit detecting positional information of the reference block; and a controller calculating positional information of the socket using the measured distance between the socket and the reference block on the basis of the detected positional information of the reference block and controlling the robot using the calculated positional information of the socket.

13 Claims, 4 Drawing Sheets

SYSTEM TO TEST ELECTRONIC PART AND METHOD OF CONTROLLING THE SAME

CROSS-REFERENCE TO RELATED APPLICATIONS

This application claims the benefit of Korean Patent Application No. 2007-30780, filed on Mar. 29, 2007 in the Korean Intellectual Property Office, the disclosure of which is incorporated herein by reference.

BACKGROUND

1. Field

The present invention relates to a system to testing an electronic part, and, more particularly, to a system to testing an electronic part and a method of controlling the same, which are capable of automatically detecting a position of a socket according to a variation in position of the socket so as to test the electronic part.

2. Description of the Related Art

Recently, as semiconductor technology has been rapidly developed, the small size and high density of all electrical/electronic apparatuses have been realized. In addition, as industrial robots have been developed, test devices to test the capabilities of the electrical/electronic apparatuses using the robots have been developed.

For example, when a memory chip is manufactured and is then mounted on a main board, which is actually used in a user environment, to test a capability of the memory chip, an industrial robot is used to automatically insert/separate the memory chip into/from a socket mounted on the main board.

In order to test the capability of an electronic part, the position of a socket into which the electronic part is inserted is input to a robot via an offline work program, and the position of the socket is detected on the basis of a reference block which is a reference tool to detect the position of the socket using a contact sensor.

After the position of the socket is detected, a memory chip is inserted into the socket using the robot, the capability of the memory chip is tested, and the inserted memory chip is separated from the socket using the robot.

However, since the main board, which is a major component of the work box to test the memory chip, should be changed to a new model over time, serious problems may occur at the time of the automation of the system.

That is, whenever the main board is replaced with a new board, a position into which a memory chip is inserted should be newly changed and input to the robot. This problem may occur when the main board is repaired and mounted again as well as when the main board is replaced with a new board.

Accordingly, it takes a great deal of time to newly change and input the insertion position of the memory chip into the robot. Since such time corresponds to a time when the system is stopped, the efficiency of the system decreases.

SUMMARY

Therefore, it is an aspect of the embodiment to provide a system to test an electronic part having an improved structure and a method of controlling the same, which are capable of automatically detecting the position of a socket according to a variation in position of the socket to efficiently test the electronic part and increasing the efficiency of the system.

Additional aspects and/or advantages will be set forth in part in the description which follows and, in part, will be obvious from the description, or may be learned by practice of the invention.

In accordance with the embodiment, the above and/or other aspects can be achieved by the provision of a system to test an electronic part using a robot to automatically test the electronic part including: a distance measuring unit measuring a distance between a socket mounted on a substrate to test the electronic part and a reference block to provide a reference position; a position measuring unit detecting positional information of the reference block; and a controller calculating positional information of the socket using the measured distance between the socket and the reference block on the basis of the detected positional information of the reference block and controlling the robot using the calculated positional information of the socket.

The distance measuring unit may measure the distance between the socket and the reference block using a vision system.

The position measuring unit may detect the positional information of the reference block using a laser sensor.

The position measuring unit may detect the positional information of the reference block using a degree of which beams irradiated from the laser sensor to the reference block are reflected.

The position measuring unit may detect the position information using sides of an upper surface of the reference blocks. The position measuring unit may determine the sides of the upper surface of the reference block and detect the positional information of the reference block when the beams irradiated from the laser sensor to the reference block are not reflected.

The foregoing and/or other aspects are achieved by providing a method of controlling a system to test an electronic part using a robot to automatically test the electronic part including: measuring a distance between a socket mounted on a substrate to test the electronic part and a reference block to provide a reference position; detecting positional information of the reference block; calculating positional information of the socket using the measured distance between the socket and the reference block on the basis of the detected positional information of the reference block; and controlling the robot using the calculated positional information of the socket.

The measuring of the distance may include measuring the distance between the socket and the reference block using a vision system.

The detecting positional information of the reference block may include detecting the positional information of the reference block using a laser sensor.

The detecting positional information of the reference block may include detecting the positional information of the reference block using a degree of which beams irradiated from the laser sensor to the reference block are reflected.

The detecting positional information of the reference block may include detecting the position information using sides of an upper surface of the reference blocks.

The detecting positional information of the reference block may include determining the sides of the upper surface of the reference block and detecting the positional information of the reference block when the beams irradiated from the laser sensor to the reference block are not reflected.

The foregoing and/or other aspects are achieved by providing a method of controlling a system to test an electronic part, the method including: measuring a distance between a socket mounted on a substrate to test the electronic part and a reference block; detecting positional information of the reference block, the positional information being detected in accordance with whether beams irradiated onto the reference block are reflected; and calculating positional information of the socket using the measured distance between the socket and the reference block on the basis of the detected positional information of the reference block.

Sides of the reference block may be detected when it is determined that the beams irradiated onto the reference block are not reflected.

The system may include a sensor to detect whether the beams irradiated onto the reference block are reflected, and the sensor is moved from an initial detecting position to a second detecting position when it is determined that the beams irradiated onto the reference block are reflected.

BRIEF DESCRIPTION OF THE DRAWINGS

These and/or other aspects and advantages will become apparent and more readily appreciated from the following description of the embodiment, taken in conjunction with the accompanying drawings of which.

DETAILED DESCRIPTION OF THE EMBODIMENTS

Figure 1:
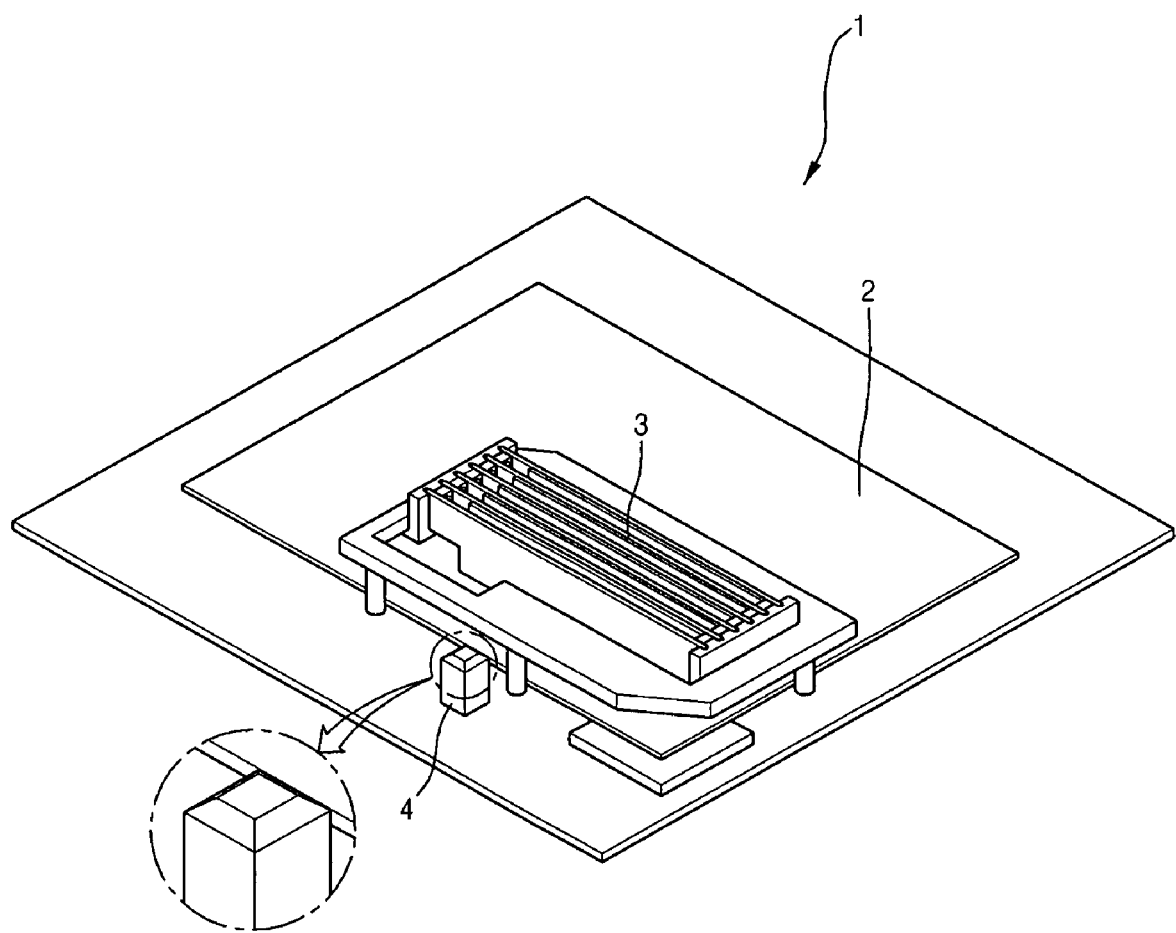
FIG. 1 is a view showing a work box to test an electronic part.

Reference will now be made in detail to the embodiment, examples of which are illustrated in the accompanying drawings, wherein like reference numerals refer to the like elements throughout. The embodiment is described below to explain the present invention by referring to the figures.

Figure 3:
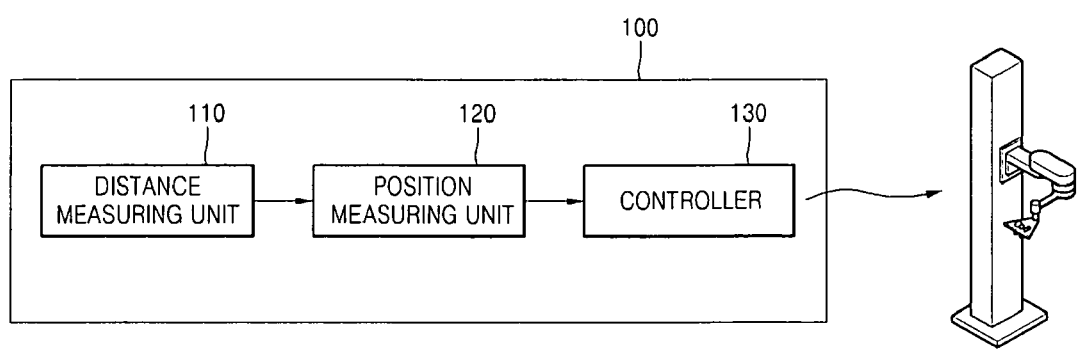
FIG. 3 is a block diagram showing a system to test an electronic part according to an embodiment.

First, FIG. 3 is a block diagram showing a system to test an electronic part according to an embodiment. The system 100 to test the electronic part includes a distance measuring unit 110, a position measuring unit 120 and a controller 130.

Figure 2:
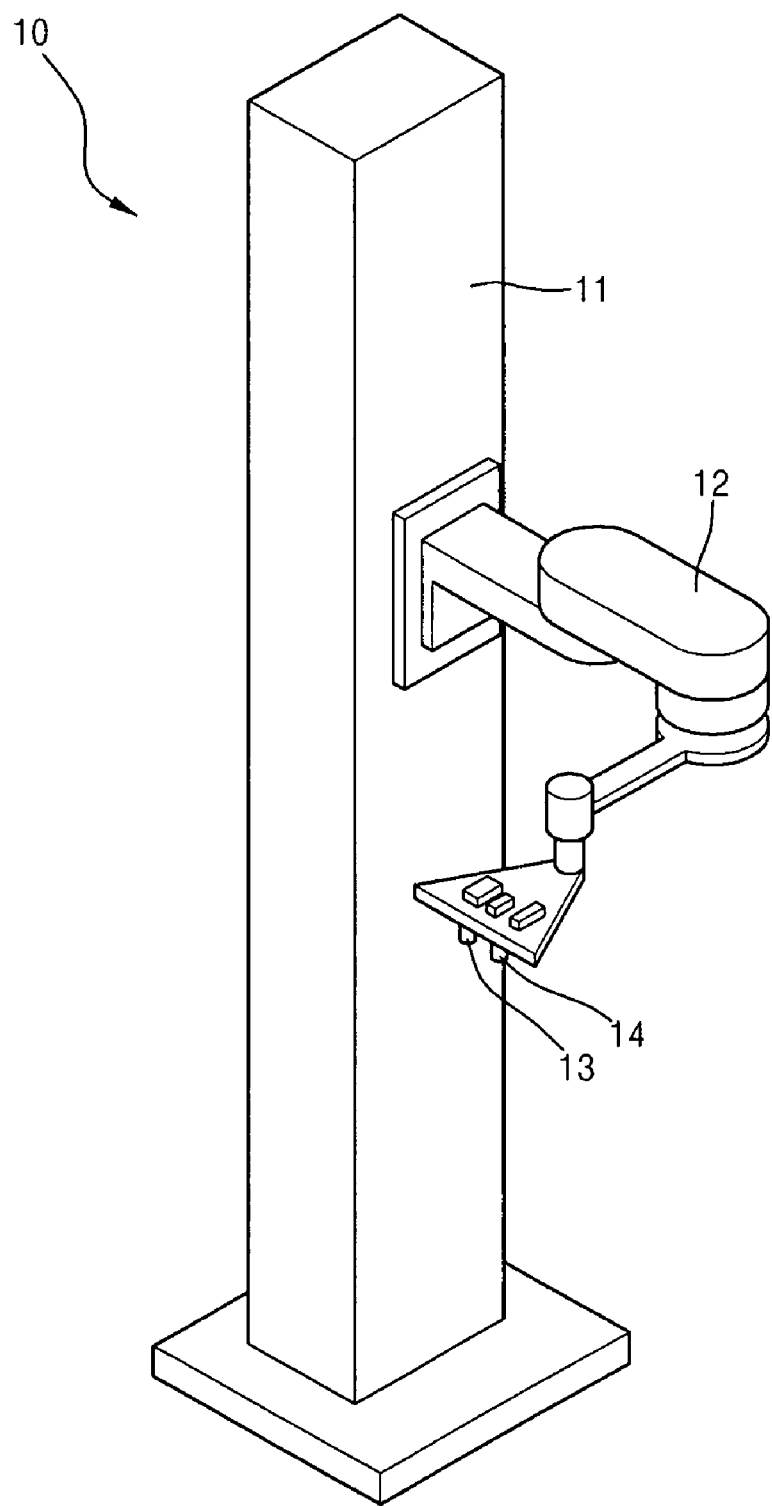
FIG. 2 is a view showing a robot used to automatically test the electronic part.

The system 100 to test the electronic part includes a work box 1 and a robot 10 in order to test the electronic part, as shown in FIGS. 1 and 2.

The work box 1 is a structure in which a substrate 2 to test the electronic part is mounted and is attached/detached to/from the system. A power supply for a personal computer (PC) and a hard disc are provided in the work box such that the work box performs a function similar to that of a general PC.

In the work box 1, the substrate 2, a socket 3 mounted on the substrate 2 to mount an electronic part thereon in order to test the electronic part, and a reference block 4 to provide a reference position are mounted.

In order to automatically test the capability of the electronic part using the robot 10, since a process of detecting positional information of the socket 3 and supplying the detected positional information of the socket 3 to the robot 10 is required, the distance measuring unit 110 measures a distance between the socket 3 and the reference block 4 in order to detect the positional information of the socket 3.

In more detail, it is preferable that the distance measuring unit 110 receives and analyzes an actual image of the work box and measures the distance between the socket 3 and the reference block 4 using a vision system. The socket 3 and the reference block 4 are visually sensed using an optical fiber and a light emitting diode (LED) included in the vision system to measure the distance between the socket 3 and the reference block 4.

Here, the reference block 4 is a tool to provide the reference position information in order to detect the positional information of the socket 3. The reference block 4 has a predetermined area. The reference block 4 mounted in the work box 1 is located in a predetermined range. If the reference block 4 has the predetermined area, beams from a laser sensor 14 are allowed to be irradiated onto the reference block 4.

Next, the position measuring unit 120 detects the positional information of the reference block 4.

That is, after the distance between the socket 3 and the reference block 4 is measured using the vision system, the positional information of the reference block 4 is detected using the laser sensor 14 mounted in the robot 10.

In more detail, the positional information of the reference block 4 can be detected using a degree of which the beams irradiated from the laser sensor 14 to the reference block 4 are reflected. In order to irradiate the beams onto the reference block 4, the robot 10 moves the laser sensor 14 to a predetermined position.

Here, an arm 12 of the robot 10, attached to a robot arm support 11, moves while the beams move from the reference block 4 in a travel direction of the robot 10 (the robot has a travel shaft to mount the electronic part in a plurality of work boxes 1) such that the position of the laser sensor 14 can be changed. The laser sensor 14 moves to be located above the reference block 4, which is located at the predetermined position, such that the beams form the laser sensor 14 are irradiated onto an upper surface of the reference block 4. The reference block 14 having the predetermined area is designed such that the beams from the laser sensor 14 are irradiated onto the upper surface of the reference block 4 even when the substrate 2 is replaced or exchanged.

Accordingly, a degree of which the beams irradiated from the laser sensor 14 onto the upper surface of the reference block 4 are reflected and a degree of which the irradiated beams are reflected when the laser sensor 14 moves to another position are compared to detect the positional information of the reference block 4.

The position measuring unit 120 is configured to detect the positional information of the reference block 4 using sides of the reference block 4. As described above, in order to easily detect the positional information of the reference block 4 using the sides of the reference block 4, it is preferable that the sides of the upper surface of the reference block 4 are truncated.

That is, when the beams are irradiated from the laser sensor 14 onto the flat upper surface of the reference block 4, most of the beams are reflected and returned. In contrast, when the beams are irradiated from the laser sensor 14 onto the sides of the upper surface of the reference block 4, the beams are not reflected and returned due to the truncated sides. Accordingly, the sides of the reference block 4 can be detected and the positional information of the reference block 4 can be detected using the detected sides.

After the process of detecting the positional information of the reference block 4 is performed as described above, the controller 130 calculates the positional information of the socket 3 using the measured distance between the socket 3 and the reference block 4 on the basis of the detected positional information of the reference block 4 and controls the robot 10 using the calculated positional information of the socket 3.

That is, the positional information (coordinate information) of the socket 3 is accurately calculated using the distance between the socket 3 and the reference block 4 measured by the distance measuring unit 110 on the basis of the detected positional information of the reference block 4, and the calculated positional information of the socket 3 is sent to the robot 10 to control the robot 10 such that the electronic part is mounted using the positional information of the socket 3.

The electronic part is tested by a program stored in the hard disc of the work box 1. When the test of the electronic part is completed, the controller 130 controls a hand 13 of the robot to move to the calculated position of the socket 3 such that the electronic part is separated from the socket 3. Then, the electronic part is stored according to the test result of the electronic part, that is, according to good and bad qualities.

When the reference block 4 is mounted at a predetermined position of the substrate 2 or the work box 1 and the distance between the socket 3 and the reference block 4 is measured by the distance measuring unit 110, instead of the reference block 4 to provide the reference position, the present embodiment may be implemented on the basis of a reference block 4 located at any other position, using a method of acquiring positional information from a predetermined reference point of the work box 1 to the reference block 4 and sending the positional information to the robot 10.

Hereinafter, a method of controlling the system to test the electronic part will be described.

Figure 4:
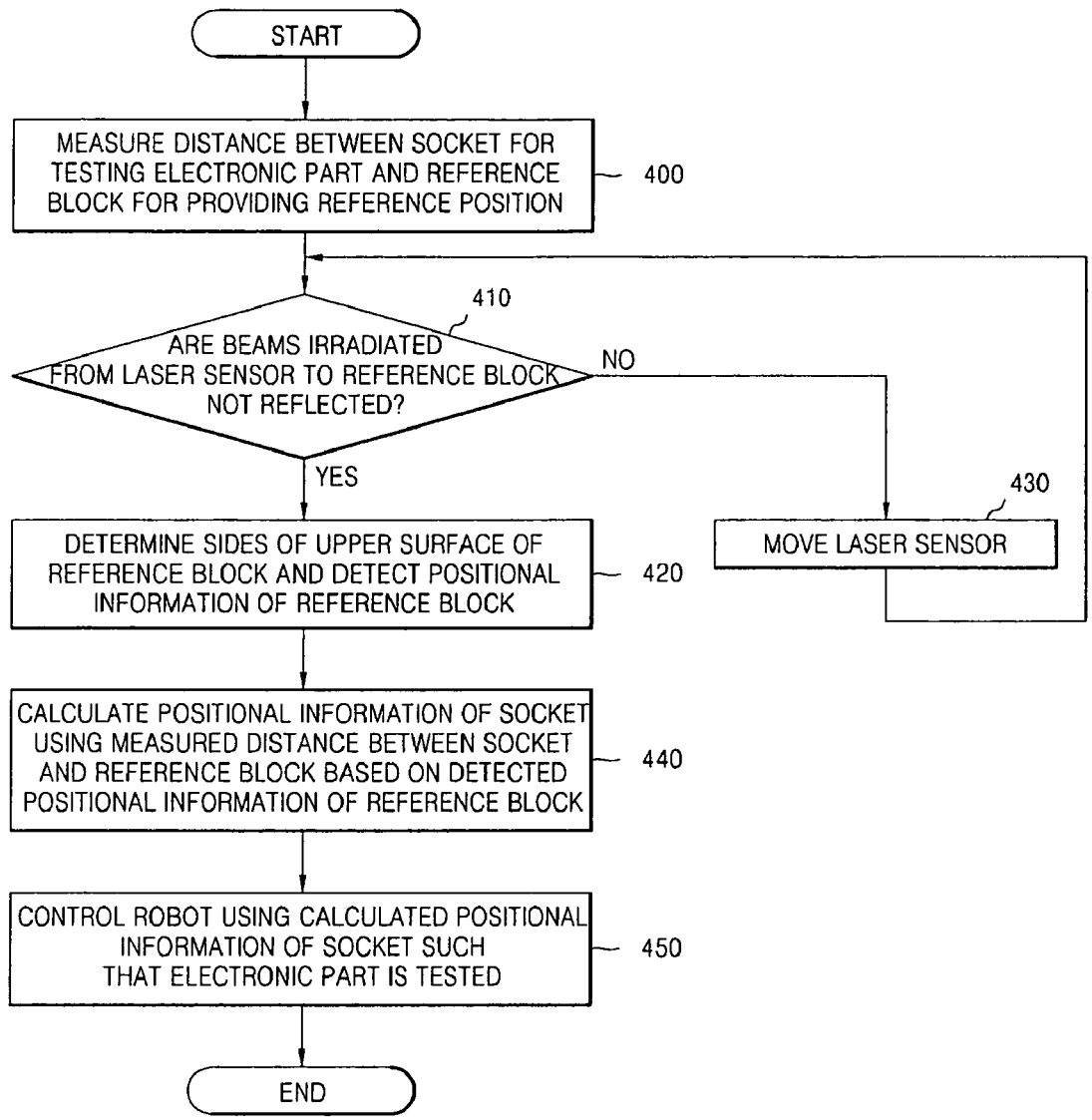
FIG. 4 is a flowchart illustrating a method of controlling the system to test the electronic part according to the embodiment.

FIG. 4 is a flowchart illustrating a method of controlling the system to test the electronic part according to the embodiment. As shown in FIG. 4, the distance between the socket to test the electronic part and the reference block to provide the reference position is measured (400).

It is determined whether the beams irradiated from the laser sensor to the reference block are not reflected (410). If the beams irradiated from the laser sensor to the reference block are not reflected, the sides of the reference block are determined and the positional information of the reference block is detected (420). Thereafter, the procedure returns to operation 410.

Here, in order to detect the positional information of the reference block 4, the sides of the upper surface of the reference block are truncated and the degree of which the beams irradiated from the laser sensor to the sides of the upper surface of the reference block are reflected are detected.

When the beams are irradiated from the laser sensor onto the flat upper surface of the reference block, most of the beams are reflected and returned. In contrast, when the beams are irradiated from the laser sensor onto the sides of the upper surface of the reference block, the beams are not reflected and returned due to the truncated sides. Accordingly, the sides of the reference block can be detected and the positional information of the reference block can be detected using the detected sides.

If the beams irradiated from the laser sensor to the reference block are reflected, the position of the laser sensor is changed and it is determined whether the beams irradiated from the laser sensor onto the reference block are not reflected.

After the positional information of the reference block is detected, the positional information of the socket is calculated using the measured distance between the socket and the reference block on the basis of the detected positional information of the reference block (440).

Next, the robot is controlled using the calculated positional information of the socket such that the electronic part is tested (450).

That is, the robot is controlled such that the hand of the robot moves to the positional information of the socket using the calculated positional information of the socket and the electronic part is inserted into the socket.

As described above, according to a system to test an electronic part and a method of controlling the same, it is possible to automatically detect the position of a socket according to a variation in position of the socket and efficiently test the electronic part.

Accordingly, the efficiency of the system can increase and the system to test the electronic part using a robot can be automated.

Although an embodiment has been shown and described, it would be appreciated by those skilled in the art that changes may be made in this embodiment without departing from the principles and spirit of the invention, the scope of which is defined in the claims and their equivalents.

What is claimed is:

1. A system to test an electronic part using a robot to automatically test the electronic part, the system comprising:
   a reference block providing a reference position, sides of an upper surface of the reference block being truncated;
   a distance measuring unit measuring a distance between a socket mounted on a substrate to test the electronic part and the reference block;
   a position measuring unit detecting positional information of the reference block using reflections of beams onto the truncated sides of the upper surface of the reference block; and
   a controller calculating positional information of the socket using the measured distance between the socket and the reference block on the basis of the detected positional information of the reference block and controlling the robot using the calculated positional information of the socket.

2. The system according to claim 1, wherein the distance measuring unit measures the distance between the socket and the reference block using a vision system.

3. The system according to claim 1, wherein the position measuring unit detects the positional information of the reference block by irradiating beams onto the reference block using a laser sensor.

4. The system according to claim 3, wherein the position measuring unit detects the positional information of the reference block using a degree of which the beams irradiated from the laser sensor to the reference block are reflected.

5. The system according to claim 4, wherein the position measuring unit determines the sides of the upper surface of the reference block and detects the positional information of the reference block when the beams irradiated from the laser sensor to the reference block are not reflected.

6. A method of controlling a system to test an electronic part using a robot to automatically test the electronic part, the method comprising:
   measuring a distance between a socket mounted on a substrate to test the electronic part and a reference block to provide a reference position, sides of an upper surface of the reference block being truncated;
   detecting positional information of the reference block using reflections of beams onto the truncated sides of the upper surface of the reference block;
   calculating positional information of the socket using the measured distance between the socket and the reference block on the basis of the detected positional information of the reference block; and
   controlling the robot using the calculated positional information of the socket.

7. The method according to claim 6, wherein the measuring of the distance comprises measuring the distance between the socket and the reference block using a vision system.

8. The method according to claim 6, wherein the detecting the positional information of the reference block comprises detecting the positional information of the reference block by irradiating beams onto the reference block using a laser sensor.

9. The method according to claim 8, wherein the detecting the positional information of the reference block comprises detecting the positional information of the reference block using a degree of which beams irradiated from the laser sensor to the reference block are reflected.

10. The method according to claim 9, wherein the detecting the positional information of the reference block comprises determining the sides of the upper surface of the reference block and detecting the positional information of the reference block when the beams irradiated from the laser sensor to the reference block are not reflected.

11. A method of controlling a system to test an electronic part, the method comprising:

measuring a distance between a socket mounted on a substrate to test the electronic part and a reference block, sides of an upper surface of the reference block being truncated;

detecting positional information of the reference block, the positional information being detected based on reflections of beams onto the truncated sides of the upper surface of the reference block; and calculating positional information of the socket using the measured distance between the socket and the reference block on the basis of the detected positional information of the reference block.

12. The method according to claim 11, wherein sides of the reference block are detected when it is determined that the beams irradiated onto the reference block are not reflected.

13. The method according to claim 11, wherein the system includes a sensor to detect whether the beams irradiated onto the reference block are reflected, and the sensor is moved from an initial detecting position to a second detecting position when it is determined that the beams irradiated onto the reference block are reflected.

* * * * *